United States Patent
Kurokawa

(10) Patent No.: US 9,094,007 B2
(45) Date of Patent: Jul. 28, 2015

(54) SIGNAL PROCESSING DEVICE

(71) Applicant: SEMICONDUCTOR ENERGY LABORATORY CO., LTD., Atsugi-shi, Kanagawa-ken (JP)

(72) Inventor: Yoshiyuki Kurokawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/271,820

(22) Filed: May 7, 2014

(65) Prior Publication Data

US 2014/0340115 A1    Nov. 20, 2014

(30) Foreign Application Priority Data

May 14, 2013 (JP) ................. 2013-102068

(51) Int. Cl.
  *H03K 19/177*   (2006.01)
  *H01L 25/00*    (2006.01)
  *H03K 19/094*   (2006.01)

(52) U.S. Cl.
  CPC .................. *H03K 19/094* (2013.01)

(58) Field of Classification Search
  None
  See application file for complete search history.

(56) References Cited

U.S. PATENT DOCUMENTS

| 5,731,856 | A |   | 3/1998  | Kim et al.     |          |
|-----------|---|---|---------|----------------|----------|
| 5,744,864 | A |   | 4/1998  | Cillessen et al. |        |
| 5,841,694 | A | * | 11/1998 | Wong           | 365/185.05 |
| 6,127,702 | A |   | 10/2000 | Yamazaki et al. |         |
| 6,294,274 | B1 |   | 9/2001  | Kawazoe et al. |          |
| 6,563,174 | B2 |   | 5/2003  | Kawasaki et al. |         |
| 6,727,522 | B1 |   | 4/2004  | Kawasaki et al. |         |

(Continued)

FOREIGN PATENT DOCUMENTS

| EP | 1737044 A | 12/2006 |
| EP | 2226847 A | 9/2010  |

(Continued)

OTHER PUBLICATIONS

Ishii.T et al., "A Poly-Silicon TFT With a Sub-5-nm Thick Channel for Low-Power Gain Cell Memory in Mobile Applications". IEEE Transactions on Electron Devices, Nov. 1, 2004, vol. 51, No. 11, pp. 1805-1810.

(Continued)

*Primary Examiner* — Anh Tran
(74) *Attorney, Agent, or Firm* — Fish & Richardson P.C.

(57) ABSTRACT

A signal processing device is provided. In a programmable switch in which one of a source and a drain of a first transistor is connected to a gate of a second transistor to control continuity between a source and a drain of the second transistor, a capacitance connected to the gate of the second transistor (which is indicated by $C_S$ and includes a parasitic capacitance) is less than twice a capacitance represented by the following formula:

$$C_{gs} + \frac{C_{gd}C}{C_{gd}+C},$$

where C is a load capacitance, $C_{gs}$ is a capacitance between the source and gate of the second transistor, and $C_{gd}$ is a capacitance between the drain and gate of the second transistor.

20 Claims, 11 Drawing Sheets

(56) References Cited

U.S. PATENT DOCUMENTS

| | | |
|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,547,753 B2 | 10/2013 | Takemura et al. |
| 8,675,382 B2 | 3/2014 | Kurokawa |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2011/0175646 A1 | 7/2011 | Takemura et al. |
| 2012/0212995 A1 | 8/2012 | Kurokawa |
| 2012/0293200 A1 | 11/2012 | Takemura |
| 2012/0293242 A1* | 11/2012 | Kato ........................... 327/530 |
| 2013/0207170 A1 | 8/2013 | Kurokawa |
| 2013/0285697 A1 | 10/2013 | Kurokawa |
| 2013/0286757 A1 | 10/2013 | Takemura |
| 2013/0293263 A1* | 11/2013 | Kurokawa ..................... 326/41 |
| 2013/0314124 A1 | 11/2013 | Ikeda et al. |
| 2013/0321025 A1 | 12/2013 | Kurokawa et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAMs", IEEE Tranactions on Electron Devices Meeting, Jun. 1, 1994, vol. 41, No. 6, pp. 926-931.

Chun.K et al., "A 3T Gain Cell Embedded DRAM Utilizing Preferential Boosting for High Density and Low Power On-Die Caches", IEEE Journal of Solid-State Circuits, Jun. 1, 2011, vol. 46, No. 6, pp. 1495-1505.

Eslami.F et al., "Capacitive Boosting for FPGA Interconnection Networks", 21st International Conference on Field Programmable Logic and Applications, 2011, vol. 21, pp. 453-458.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

(56) References Cited

OTHER PUBLICATIONS

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:AL and SN-Doped Zinc Indium Oxide Thin Film Transistors for AMOLED Backplane", SID Digest '09 ; SID International Symposium Digest of Techinical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZNO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 621-624.

Hayashi.R et al., "42.1: Invited Paper: Improved Amorphous In—Ga—Zn—O TFTs", SID Digest '08 : SID International Symposium Digest of Techincal Papers, May 20, 2008, vol. 39, pp. 621-624.

Hirao.T et al., "Novel Top-Gate Zinc Oxide Thin-Film Transistors (ZnO TFTs) for AMLCDS", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID '04 : SID International Symposium Digest of Technical Papers 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composities for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1730-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the IN2O3 and SC2O3—A2O3—BO Systems [A; Fe, Ga, Or Al; B: Mg, Mn, Fe, Ni, Cu, Or Zn] at Temperatures over 1000° C.". Journal of Solid State Chemistry, 1985, vol. 60, pp. 382-384.

Kimizuka.N et al. "Syntheses and Single-Crystal Data of Homologous Compounds, In2O3(ZnO)m (m=3, 4, and 5) InGaO3(ZnO)3, and Ga2O3(ZnO)m (m=7, 8, 9, and 16) in the In2O3—ZnGa2O4—ZnO System ", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Jounal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide—Based Thin-Film Transistors by DC Sputtering", SID Digest '09 ; SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of The 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homogous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

(56) References Cited

OTHER PUBLICATIONS

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 ; SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn—Oxide TFTs With a Novel Passivation Layer", SID Digest '09 ; SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

10

SIGNAL PROCESSING DEVICE

BACKGROUND OF THE INVENTION

1. Field of the Invention

This disclosure relates to a signal processing device.

2. Description of the Related Art

Patent Documents 1 to 3, for example, each disclose a signal processing device (programmable logic device: PLD) in which with the use of a transistor that achieves ultra-high off-state resistance by using an oxide semiconductor or the like, charge accumulated in a gate capacitor of a pass transistor or a capacitor electrically connected to the gate of the pass transistor is controlled so that the on/off state of the pass transistor is maintained for a long time, and substantial connection between nodes through the pass transistor is controlled without changing apparent connection in a circuit configuration.

REFERENCE

Patent Document 1: U.S. Pat. No. 8,547,753
Patent Document 2: United States Patent Application Publication No. 2012/0212995
Patent Document 3: United States Patent Application Publication No. 2012/0293200

SUMMARY OF THE INVENTION

An object is to provide a method for improving the performance of a signal processing device, or a signal processing device or the like designed with the method.

Provided is a signal processing device in which one of a source and a drain of a first transistor is connected to a gate of a second transistor (pass transistor). A capacitance at a node where one of the source and the drain of the first transistor is connected to the gate of the second transistor is less than twice the sum of a combined series capacitance of a load capacitance connected to one of a source and a drain of the second transistor and a capacitance between the gate and one of the source and the drain of the second transistor, and a capacitance between the gate and the other of the source and the drain of the second transistor (the sum is represented by Formula 6 to be shown below). The channel width of the second transistor is at least four times that of a transistor in a next-stage gate circuit or the like.

Switching characteristics of a programmable switch can be improved. Moreover, the design criteria for a programmable switch can be established. Note that the effects of this disclosure are not limited to the above and will be described in detail below.

BRIEF DESCRIPTION OF THE DRAWINGS

In the accompanying drawings.

DETAILED DESCRIPTION OF THE INVENTION

Hereinafter, embodiments will be described in detail with reference to the accompanying drawings. Note that embodiments are not limited to the following description, and it will be easily understood by those skilled in the art that modes and details can be modified in various ways without departing from the spirit and scope of the present invention. Therefore, the contents in this disclosure are not interpreted as being limited to the description of the embodiments below.

Note that a source of a transistor sometimes means a source region that is part of a semiconductor film functioning as an active layer or a source electrode electrically connected to the semiconductor film. Similarly, a drain of a transistor sometimes means a drain region that is part of a semiconductor film functioning as an active layer or a drain electrode electrically connected to the semiconductor film. A gate sometimes means a gate electrode.

Embodiment 1

Figure 1A:
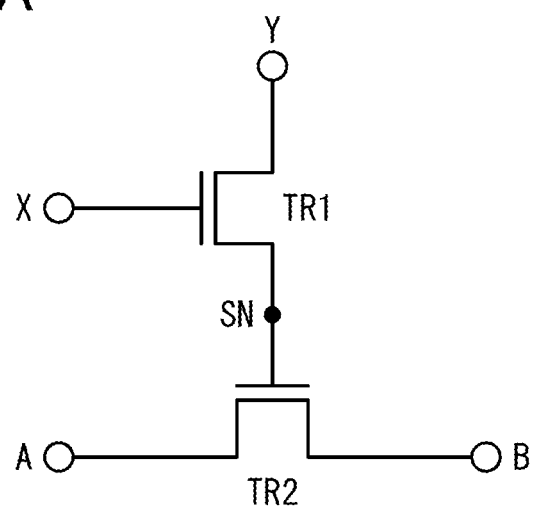
FIGS. 1A and 1B illustrate circuit examples of a signal processing device described in Embodiment 1.
Figure 1B:
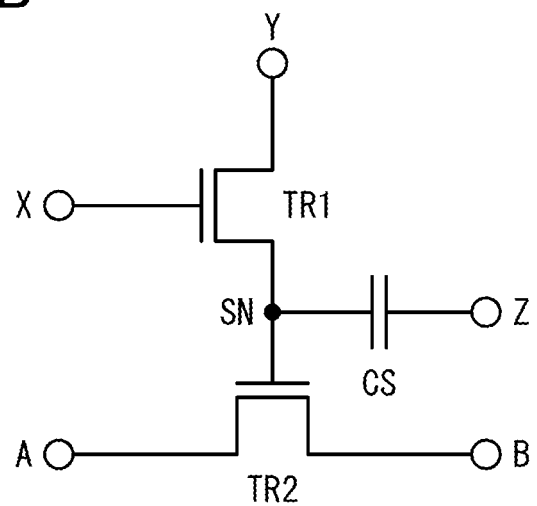

FIGS. 1A and 1B each illustrate an example of a circuit used in a signal processing device. In the circuit illustrated in FIG. 1A, continuity between two nodes, a node A and a node B, is controlled by a second transistor (pass transistor) TR2. Such a circuit is called a programmable switch. Here, a gate of the second transistor TR2 is connected to one of a source and a drain of a first transistor TR1. The on/off state of the first transistor TR1 is controlled by the potential of a gate of the first transistor TR1 (a node X).

The first transistor TR1 can be any kind of transistor but needs to have sufficiently high off-state resistance (i.e., sufficiently low off-state current) in order to maintain the potential of the gate of the second transistor TR2 (a node SN) for a required period of time. For example, the first transistor TR1 can be any of the transistors disclosed in Patent Documents 1 to 3. The second transistor TR2 can be of various kinds and is preferably a transistor with low on-state resistance.

The circuit illustrated in FIG. 1A operates as follows. For example, after the first transistor TR1 is turned on, the potentials of a source and a drain of the second transistor TR2 are set at low level, and the potential of the node SN is made higher than the sum of the low-level potential and the threshold voltage of the second transistor TR2 and then the first transistor TR1 is turned off. Thus, the second transistor TR2 operates in the strong inversion mode, and the potential of the node SN is held by a capacitance formed between the gate and a channel of the second transistor TR2. At this time, continuity between the node A and the node B is established because the second transistor TR2 is on.

For example, when the potential of the node SN is set at low level after the first transistor TR1 is turned on, even if the first transistor TR1 is subsequently turned off, the potential of the node SN might not be sufficiently maintained because second transistor TR2 is in the weak inversion mode and the capacitance formed between the gate and the channel or the like of the second transistor TR2 is very small as a result.

However, when the potential of the other of the source and the drain of the first transistor TR1 (a node Y) is kept at low level, the potential of the node SN can be kept at low level. Note that the resistance of a gate insulating film of the second transistor TR2 is assumed to be infinite. At this time, continuity between the node A and the node B is not established because the second transistor TR2 is off.

To improve the retention characteristics of the node SN, one electrode of a capacitor CS may be connected to the node SN as illustrated in FIG. 1B. The potential of the other electrode of the capacitor CS (a node Z) is kept at an appropriate potential. Note that the capacitor CS includes a capacitance that is formed unintentionally (because of parasitic capacitance) as well as one that is formed intentionally. In some cases, only a capacitance due to the parasitic capacitance serves as the capacitor CS.

In the circuit described above, arithmetic operation is generally performed while the first transistor TR1 is off. In this case, the node SN is floating. Moreover, the node SN is capacitively coupled through the gate capacitance of the second transistor TR2, the capacitance of the capacitor CS, or the like; thus, the potential of the node SN changes with variations in the potentials of the node A and the node B.

In other words, when the potential of the node SN is higher than the sum of the threshold voltage of the second transistor TR2 and the potential of the source or drain of the second transistor TR2, the second transistor TR2 is in the strong inversion mode and the capacitance between the gate and the channel is large, so that the potential of the node SN increases as the potential of the node A or the node B becomes higher. This effect is called boosting effect. When the potential of the node SN becomes higher than the sum of the potential of the node A and the threshold voltage of the second transistor TR2, the potential of the node B becomes equal to that of the node A. When the potential of the node SN does not increase at all, the potential of the node B becomes lower than that of the node A by the threshold voltage of the second transistor TR2.

Such effect is not produced in a signal processing device in which an SRAM cell is connected to a gate of a pass transistor so that a constant voltage is supplied. In this case, the potential of the gate of the pass transistor is required to be set sufficiently high in advance.

In general, the boosting effect becomes larger as the capacitance between the gate and the channel of the second transistor TR2 is larger and the capacitance of the capacitor CS is smaller. Meanwhile, a smaller capacitance of the capacitor CS degrades the retention characteristics of the node SN, and a finer circuit pattern results in a smaller capacitance between the gate and the channel of the second transistor TR2. Further, signal delay and signal integrity need to be considered in transmitting a signal from the node A to the node B.

In the circuit in FIG. 1A, the potential of the gate of the second transistor TR2 rises as a potential supplied to the node A rises. This is caused by capacitive coupling due to the capacitance between the gate and the source of the second transistor TR2. The rise in the gate potential (primary boosting effect) accelerates the rise in the potential of the node B resulting from capacitive coupling due to the capacitance between the gate and the drain of the second transistor TR2 (secondary boosting effect).

The boosting effect is generally intended to transmit the potential of the node A to the node B completely by raising the potential of the node SN or to increase the on-state current of the second transistor TR2 by raising the gate potential; accordingly, the secondary boosting effect does not draw much attention.

However, positive use of the secondary boosting effect can lead to increase in response speed at the time of rise or fall of a potential supplied to the node A. Further, in the circuit illustrated in FIG. 1B, the capacitor CS, which is connected to improve the charge retention characteristics, is also an important item to be considered. Specifically, optimization of the capacitance of the capacitor CS is important in obtaining circuit design criteria because increase in the capacitance of the capacitor CS prevents the boosting effect from occurring.

Figure 2A:
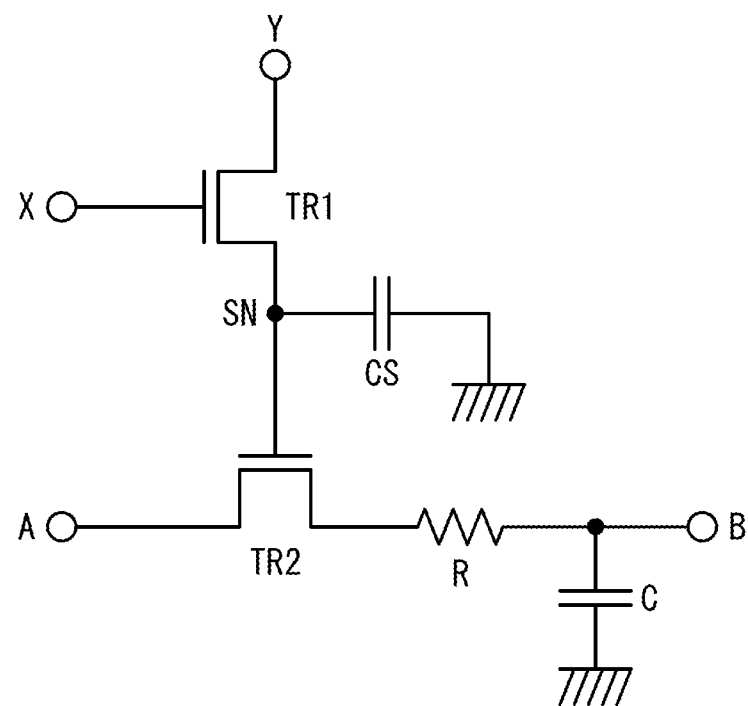
FIGS. 2A and 2B illustrate a circuit example of a signal processing device described in Embodiment 1 and an example of an equivalent circuit.

The circuit illustrated in FIG. 1A or FIG. 1B is represented as a circuit illustrated in FIG. 2A in consideration of an actual circuit. The circuit in FIG. 2A includes the first transistor TR1, the second transistor TR2, and the capacitor CS. The node B is assumed to be connected to a next-stage CMOS gate circuit, which is replaced with a load resistance R and a load capacitance C. The load capacitance C corresponds to the input capacitance of the CMOS gate circuit. The load resistance R corresponds to the resistance of a wiring connecting the second transistor TR2 and the CMOS gate circuit. Note that the capacitor CS includes a capacitance that is formed unintentionally (parasitic capacitance) in addition to one that is provided intentionally.

Figure 2B:
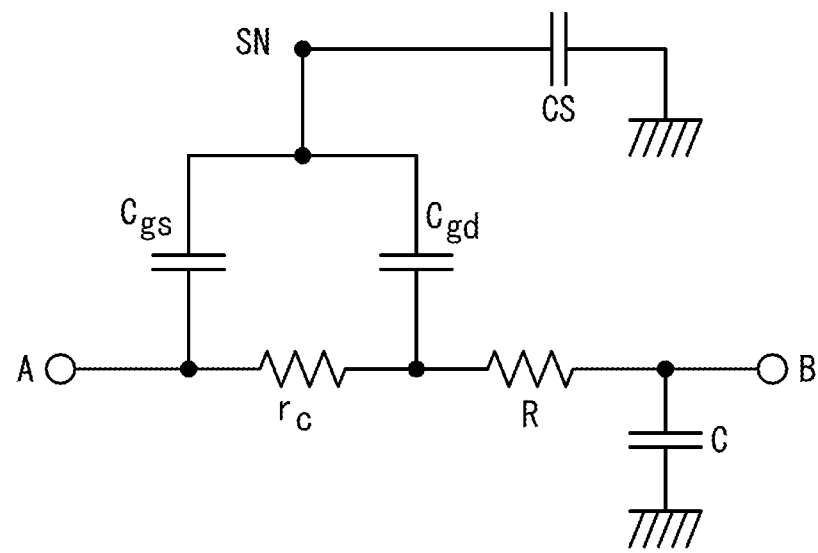

The circuit in FIG. 2A can be shown as an equivalent circuit illustrated in FIG. 2B when the capacitance of the capacitor CS is represented by $C_S$; the capacitance between the gate and the source of the second transistor TR2, $C_{gs}$; the capacitance between the gate and the drain of the second transistor TR2, $C_{gd}$; and the resistance of the channel of the second transistor TR2, $r_c$. Here, the first transistor TR1 can be omitted from the equivalent circuit because of its sufficiently high resistance.

Note that $C_{gs}$, $C_{gd}$, and $r_c$ depend on the gate potential of the second transistor TR2. Specifically, each of $C_{gs}$ and $C_{gd}$ may include a parasitic capacitance, and the gate capacitance of the channel portion of the second transistor TR2 is distributed to $C_{gs}$ and $C_{gd}$ when the gate potential of the second transistor TR2 is higher than the threshold voltage of the second transistor TR2. Although distribution ratios of 50:50 and 80:20, for example, have been suggested, the following discussion does not depend on these ratios unless otherwise specified. Note that $C_{gs}$ and $C_{gd}$ can be regarded as only a parasitic capacitance when the potential difference between the gate and source (or drain) of the second transistor TR2 is smaller than the threshold voltage of the second transistor TR2.

Using a general method of the electric circuit theory, the potential of the node B when a unit step input signal is applied to the node A in the equivalent circuit in FIG. 2B, that is, a response function y(t) can be calculated from the following formula:

$$y(t) = 1 - (k_+ e^{-\beta_+ t} + k_- e^{-\beta_- t}), \text{ where} \qquad \text{[Formula 1]}$$

$$\beta_\pm = \frac{1}{2}\left[\frac{\alpha}{CR} + \frac{\alpha-1}{Cr_c} \pm \sqrt{\left(\frac{\alpha}{CR} + \frac{\alpha-1}{Cr_c}\right)^2 - \frac{4(\alpha-1)}{C^2 R r_c}}\right], \qquad \text{[Formula 2]}$$

$$k_\pm = \frac{1}{2}\left[1 \pm \left(\frac{2}{CR}\frac{1}{1+C_S/C_{gs}} - \frac{\alpha}{CR} + \frac{\alpha-1}{Cr_c}\right)\bigg/\right.$$
$$\left.\sqrt{\left(\frac{\alpha}{CR} + \frac{\alpha-1}{Cr_c}\right)^2 - \frac{4(\alpha-1)}{C^2 R r_c}}\right], \qquad \text{[Formula 3]}$$

$$\alpha = \frac{1}{k_0}\frac{1+C_S/C_{gs//gd,C}}{1+C_S/C_{gs}}, \qquad \text{[Formula 4]}$$

$$k_0 = \frac{1}{1+C/C_{gs,gd}}, \qquad \text{[Formula 5]}$$

-continued $$C_{gs//gd,C} = C_{gs} + \frac{C_{gd}C}{C_{gd} + C}, \text{ and} \quad \text{[Formula 6]}$$

$$C_{gs,gd} = \frac{C_{gs}C_{gd}}{C_{gs} + C_{gd}}. \quad \text{[Formula 7]}$$

Note that $C_{gs//gd,C}$ is a combined parallel capacitance of $C_{gs}$ and a combined series capacitance of $C_{gd}$ and C, and $C_{gs,gd}$ is a combined series capacitance of $C_{gs}$ and $C_{gd}$. Here, the following two extreme conditions are considered to understand Formula 1.

The first extreme condition is that $r_c$ is infinite. In this case, effective capacitances of the second transistor TR2 are only $C_{gs}$ and $C_{gd}$; thus, it is understood that these capacitances can contribute only as the capacitance of a high-pass filter. The response function at this time is represented by the following formula:

$$y(t)|_{r_c=\infty} = k(1 - e^{-\alpha t/CR}), \text{ where} \quad \text{[Formula 8]}$$

$$k = k_0 \frac{1}{1 + C_S/C_{gs//gd,C}}. \quad \text{[Formula 9]}$$

A coefficient k corresponds to a contributing rate of the second transistor TR2 as a high-pass filter and satisfies 0≤k≤1. The secondary boosting effect described above is the contribution of the second transistor TR2 as a high-pass filter. Note that $C_{gs}$ and $C_{gd}$ only include a parasitic capacitance when the potential difference between the gate and source (or drain) of the second transistor TR2 is smaller than the threshold voltage of the second transistor TR2; the combined capacitance of $C_{gs}$ and $C_{gd}$ is significantly smaller than the load capacitance C. Consequently, the second transistor TR2 in the off state does not substantially contribute as a high-pass filter.

The second extreme condition is that $C_S$ is infinite. In this case, the circuit in FIG. 2A does not obtain the boosting effect at all because the gate potential of the pass transistor is regarded as a fixed potential as in a programmable switch using SRAM. The second transistor TR2 can be regarded as contributing as an RC circuit with channel resistance and gate capacitance, that is, a low-pass filter. Moreover, the load capacitance C and the load resistance R can be regarded as forming a second-order low-pass filter.

In consideration of the slope at the time t=0 that is represented by $$y^{(1)}(0) = \frac{1}{1 + C_S/C_{gs}} \frac{1}{CR}, \quad \text{[Formula 10]}$$

the slope at $C_S=\infty$ is represented by $$y^{(1)}(0)|_{C_S=\infty}=0. \quad \text{[Formula 11]}$$

Accordingly, it is reasonable to consider that the second-order low-pass filter is formed. It can be seen that an early response represented by the response function corresponds to $y(t)|_{r_c=\infty}$, i.e., the contribution of the second transistor TR2 as a high-pass filter and that a later response, following the early response, represented by the response function corresponds to the contribution of the second transistor TR2 as a low-pass filter.

A circuit design criterion for effectively using the secondary boosting effect is to increase the contribution of the second transistor TR2 as a high-pass filter, that is, to increase the coefficient k. To increase the coefficient k, the following two actions are necessary: i) increasing $C_{gs,gd}$ with respect to C in Formula 5; and ii) decreasing $C_S$ in Formula 9.

An increase in response speed is expected when k is about 0.1 or more. In such a case, the channel width of the second transistor TR2 should be about four times or more that of a next-stage gate circuit according to Action i), and $C_S$ should be less than twice $C_{gs//gd,C}$ according to Action ii). The conclusion drawn from the above is that it is preferable that the capacitor CS be not provided intentionally.

However, in the actual design phase, the size of the second transistor TR2 and the size of the capacitor CS are set in consideration of retention time in addition to response speed. For example, when the capacitance between the gate and the source of the second transistor TR2 and that between the gate and the drain of the second transistor TR2 are 0.1 fF (i.e., the channel length and the channel width are 100 nm and the thickness of a gate insulating film (equivalent oxide thickness: EOT) is 2 nm in the on state) and the off-state resistance of the first transistor TR1 is $1 \times 10^{24} \Omega$, the potential of the node SN can be maintained at a level that does not cause any practical problem for at least a month without providing the capacitor CS. Note that reduction in channel length or channel area shortens the retention time, and that increase in operating temperature reduces the off-state resistance. In such a condition, a capacitor is preferably provided intentionally.

To prevent leakage of charge from the node SN due to the tunneling effect, the physical thickness of the gate insulating film of the second transistor TR2 needs to be 6 nm or more, and for example, 8 nm or more. Accordingly, it is preferable that tunneling current be prevented by increasing the physical thickness of the gate insulating film with the use of a high dielectric constant material and that EOT be made smaller.

Note that even when a capacitor is not provided intentionally in an actual circuit designed with a design rule of about 100 nm, a capacitance of about 0.1 fF is formed at the node SN only by a parasitic capacitance between wirings.

The feature of the circuit illustrated in FIGS. 2A and 2B, which is derived from the above circuit analysis results, is the function of the second transistor TR2 as a high-pass filter, to which $C_{gs}$ and $C_{gd}$ contribute in this case. On the other hand, the channel resistance $r_c$ does not influence the contribution of the second transistor TR2 as a high-pass filter. Thus, when a potential high enough to form $C_{gs}$ and $C_{gd}$, that is, a potential for turning on the second transistor TR2 is held at the capacitor CS, the contributing rate of the second transistor TR2 as a high-pass filter does not change even if the potential varies.

When this contributing rate is high, the response speed does not change even if the potential of the node SN varies. In other words, even when the difference between a potential held at the capacitor CS and the source potential of the second transistor TR2 changes with time, the response speed of a signal from the node A to the node B is not much reduced as long as the potential is higher than or equal to the threshold voltage of the second transistor TR2. The response speed decreases drastically when the potential of the node SN becomes lower than the threshold voltage of the second transistor TR2.

On the other hand, when the contributing rate is low, the circuit corresponds to a programmable switch using SRAM under the extreme condition. In this case, the response speed varies depending on the gate potential of the second transistor TR2 because the second transistor TR2 is more likely to contribute as a low-pass filter. That is, the response speed decreases gradually when the potential of the node SN changes with time.

Accordingly, the design criteria for programmable switches can be provided. Although the second transistor TR2 is an n-channel transistor in the above description, it may be a p-channel transistor.

An oxide semiconductor that can be used for the first transistor TR1 will be described.

An oxide semiconductor contains indium, for example. An oxide semiconductor containing indium has high carrier mobility (electron mobility). An oxide semiconductor preferably contains an element M. The element M is aluminum, gallium, yttrium, or tin, for example. The element M is an element having high bonding energy with oxygen, for example. The element M increases the energy gap of the oxide semiconductor, for example. Further, the oxide semiconductor preferably contains zinc. When containing zinc, the oxide semiconductor is likely to be crystalline. The energy at the top of the valence band (Ev) of the oxide semiconductor can be controlled by, for example, the atomic ratio of zinc, in some cases.

The oxide semiconductor does not necessarily contain indium. The oxide semiconductor may be, for example, Zn—Sn oxide or Ga—Sn oxide.

The oxide semiconductor may be In—M—Zn oxide having any of the following atomic ratios of In to M when summation of In and M is assumed to be 100 atomic %: the atomic percentage of In is smaller than 50 atomic % and the atomic percentage of M is larger than or equal to 50 atomic %, and the atomic percentage of In is smaller than 25 atomic % and the atomic percentage of M is larger than or equal to 75 atomic %. Further, the oxide semiconductor may be In—M—Zn oxide having any of the following atomic ratios of In to M when summation of In and M is assumed to be 100 atomic %: the atomic percentage of In is larger than or equal to 25 atomic % and the atomic percentage of M is smaller than 75 atomic %, and the atomic percentage of In is larger than or equal to 34 atomic % and the atomic percentage of M is smaller than 66 atomic %.

The oxide semiconductor has a large energy gap. The energy gap of the oxide semiconductor is greater than or equal to 2.7 eV and less than or equal to 4.9 eV, preferably greater than or equal to 3 eV and less than or equal to 4.7 eV, more preferably greater than or equal to 3.2 eV and less than or equal to 4.4 eV.

In order to obtain stable electrical characteristics of a transistor, it is effective to reduce the concentration of impurities in the oxide semiconductor so that the oxide semiconductor is highly purified to be intrinsic. In the oxide semiconductor, a light element, a metalloid element, a metal element, or the like (lower than 1 atomic %) other than the main components serves as impurities. For example, hydrogen, lithium, carbon, nitrogen, fluorine, sodium, silicon, chlorine, potassium, calcium, titanium, iron, nickel, copper, germanium, strontium, zirconium, and hafnium might be impurities in the oxide. Accordingly, the concentration of impurities in an adjacent film is preferably reduced.

For example, in some cases, silicon in an oxide semiconductor forms impurity states. Further, in some cases, silicon at the surface of an oxide semiconductor forms impurity states. The concentration of silicon in an oxide semiconductor or at the surface of an oxide semiconductor, which is measured by secondary ion mass spectrometry (SIMS), is lower than $1\times10^{19}$ atoms/cm$^3$, preferably lower than $5\times10^{18}$ atoms/cm$^3$, more preferably lower than $2\times10^{18}$ atoms/cm$^3$.

In some cases, hydrogen in an oxide semiconductor forms impurity states, whereby carrier density is increased. Thus, the concentration of hydrogen in an oxide semiconductor film, which is measured by SIMS, is set to $2\times10^{20}$ atoms/cm$^3$ or lower, preferably $5\times10^{19}$ atoms/cm$^3$ or lower, more preferably $1\times10^{19}$ atoms/cm$^3$ or lower, still more preferably $5\times10^{18}$ atoms/cm$^3$ or lower. Further, in some cases, nitrogen in an oxide semiconductor forms impurity states, whereby carrier density is increased. Thus, the concentration of nitrogen in the oxide semiconductor, which is measured by SIMS, can be lower than $5\times10^{19}$ atoms/cm$^3$, preferably $5\times10^{18}$ atoms/cm$^3$ or lower, more preferably $1\times10^{18}$ atoms/cm$^3$ or lower, still more preferably $5\times10^{17}$ atoms/cm$^3$ or lower.

An oxide semiconductor may include a non-single crystal, for example. The non-single crystal state is structured, for example, by at least one of c-axis aligned crystal (CAAC), polycrystal, microcrystal, and an amorphous part.

An oxide semiconductor may include CAAC, for example. Note that an oxide semiconductor including CAAC is referred to as a c-axis aligned crystalline oxide semiconductor (CAAC-OS).

In an image obtained with a transmission electron microscope (TEM), for example, crystal parts can be found in the CAAC-OS in some cases. In most cases, in an image obtained with a TEM, crystal parts in the CAAC-OS each fit inside a cube whose one side is less than 100 nm, for example. In an image obtained with a TEM, a boundary between the crystal parts in the CAAC-OS is not clearly observed in some cases. Further, in an image obtained with a TEM, a grain boundary in the CAAC-OS is not clearly observed in some cases. In the CAAC-OS, since a clear grain boundary does not exist, for example, segregation of an impurity is unlikely to occur. In the CAAC-OS, since a clear boundary does not exist, for example, high density of defect states is unlikely to occur. In the CAAC-OS, since a clear grain boundary does not exist, for example, a reduction in electron mobility is unlikely to occur.

For example, the CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak at 2θ of around 31° which shows alignment appears in some cases. Further, for example, spots (luminescent spots) are observed in an electron diffraction pattern of the CAAC-OS in some cases. Note that an electron diffraction pattern obtained with an electron beam having a beam diameter of 10 nmφ or smaller or 5 nmφ or smaller is called a nanobeam electron diffraction pattern. In the CAAC-OS, for example, among crystal parts, the directions of the a-axis and the b-axis of one crystal part are sometimes different from those of another crystal part. In the CAAC-OS, for example, c-axes are aligned and a-axes and/or b-axes are not macroscopically aligned in some cases.

In each of the crystal parts included in the CAAC-OS, for example, a c-axis is aligned in a direction parallel to a normal vector of a surface where the CAAC-OS is formed or a normal vector of a surface of the CAAC-OS, triangular or hexagonal atomic arrangement that is seen from the direction perpendicular to the a-b plane is formed, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

The CAAC-OS can be formed by reduction in the density of defect states, for example. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has low density of trap states in some cases. Thus, the transistor including the oxide semiconductor in the channel formation region has a small variation in electrical characteristics and high reliability in some cases. A charge trapped by the trap states in the oxide semiconductor takes a long time to disappear. The trapped charge may behave like a fixed charge. Thus, the transistor that contains the oxide semiconductor having a high density of trap states in the channel formation region has unstable electrical characteristics in some cases.

With the use of the highly purified intrinsic or substantially highly purified intrinsic CAAC-OS in a transistor, variation in the electrical characteristics of the transistor due to irradiation with visible light or ultraviolet light is small.

An oxide semiconductor may include polycrystal, for example. Note that an oxide semiconductor including polycrystal is referred to as a polycrystalline oxide semiconductor. A polycrystalline oxide semiconductor includes a plurality of crystal grains.

An oxide semiconductor may include microcrystal, for example. Note that an oxide semiconductor including microcrystal is referred to as a microcrystalline oxide semiconductor.

In an image obtained with a TEM, for example, crystal parts cannot be found clearly in the microcrystalline oxide semiconductor in some cases. In most cases, the size of a crystal part included in the microcrystalline oxide semiconductor ranges from 1 nm to 100 nm, or from 1 nm to 10 nm, for example. A microcrystal with a size greater than or equal to 1 nm and less than or equal to 10 nm is specifically referred to as nanocrystal (nc), for example. An oxide semiconductor including nanocrystal is referred to as a nanocrystalline oxide semiconductor (nc-OS). In an image of the nc-OS obtained with a TEM, for example, a boundary between crystal parts is not clearly observed in some cases. In an image of the nc-OS obtained with a TEM, since a clear grain boundary does not exist, for example, segregation of an impurity is unlikely to occur. In the nc-OS, since a clear grain boundary does not exist, for example, high density of defect states is unlikely to occur. In the nc-OS, since a clear grain boundary does not exist, for example, a reduction in electron mobility is unlikely to occur.

In the nc-OS, for example, a microscopic region (e.g., a region with a size greater than or equal to 1 nm and less than or equal to 10 nm) has a periodic atomic order occasionally. Further, for example, in the nc-OS, crystal parts are not regularly arranged. Thus, there is a case where periodic atomic order is not observed macroscopically or a case where long-range order in atomic arrangement is not observed. Accordingly, in some cases, the nc-OS cannot be distinguished from an amorphous oxide semiconductor, for example, depending on an analysis method. When the nc-OS is analyzed by an out-of-plane method with an XRD apparatus using an X-ray having a beam diameter larger than the diameter of a crystal part, a peak that shows alignment does not appear in some cases. Further, for example, a halo pattern is shown in some cases in an electron diffraction pattern of the nc-OS obtained by using an electron beam having a beam diameter larger than the diameter of a crystal part (e.g., a beam diameter of 20 nm$\phi$ or more, or 50 nm$\phi$ or more). For example, spots are shown in some cases in a nanobeam electron diffraction pattern of the nc-OS obtained by using an electron beam having a beam diameter smaller than or equal to the diameter of a crystal part (e.g., a beam diameter of 10 nm$\phi$ or less, or 5 nm$\phi$ or less). In a nanobeam electron diffraction pattern of the nc-OS, for example, regions with high luminance in a circular pattern are shown in some cases. Moreover, in a nanobeam electron diffraction pattern of the nc-OS, for example, a plurality of spots is shown in the region in some cases.

Since the microscopic region in the nc-OS has a periodic atomic order occasionally, the nc-OS has lower density of defect states than the amorphous oxide semiconductor. Note that since crystal parts in the nc-OS are not regularly arranged, the nc-OS has higher density of defect states than the CAAC-OS.

Note that an oxide semiconductor film may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a stacked structure of two or more of an amorphous oxide semiconductor region, a microcrystalline oxide semiconductor region, a polycrystalline oxide semiconductor region, and a CAAC-OS region in some cases.

An oxide semiconductor film may be a multilayer film. For example, a multilayer film in which an oxide semiconductor layer S1 and an oxide semiconductor layer S2 are formed in this order may be used.

In this case, the conduction band edge (Ec) of the oxide semiconductor layer S2 is made lower than that of the oxide semiconductor layer S1, for example. Specifically, for the oxide semiconductor layer S2, an oxide semiconductor having higher electron affinity than the oxide semiconductor layer S1 by 0.07 eV or more and 1.3 eV or less, preferably 0.1 eV or more and 0.7 eV or less, further preferably 0.15 eV or more and 0.4 eV or less is used. Note that the electron affinity refers to an energy gap between the vacuum level and the conduction band edge.

Alternatively, the energy gap of the oxide semiconductor layer S2 is made smaller than that of the oxide semiconductor layer S1, for example. The energy gap can be obtained by an optical method, for example. Specifically, for the oxide semiconductor layer S2, an oxide semiconductor having smaller energy gap than the oxide semiconductor layer S1 by 0.1 eV or more and 1.2 eV or less, preferably 0.2 eV or more and 0.8 eV or less is used.

Alternatively, an oxide semiconductor film may be, for example, a multilayer film in which the oxide semiconductor layer S1, the oxide semiconductor layer S2, and an oxide semiconductor layer S3 are formed in this order.

For example, the conduction band edge (Ec) of the oxide semiconductor layer S2 is made lower than that of the oxide semiconductor layers S1 and S3. Specifically, for the oxide semiconductor layer S2, an oxide semiconductor having higher electron affinity than the oxide semiconductor layers S1 and S3 by 0.07 eV or more and 1.3 eV or less, preferably 0.1 eV or more and 0.7 eV or less, further preferably 0.15 eV or more and 0.4 eV or less is used.

Alternatively, for example, the energy gap of the oxide semiconductor layer S2 may be smaller than that of each of the oxide semiconductor layers S1 and S3. Specifically, for the oxide semiconductor layer S2, an oxide semiconductor having smaller energy gap than the oxide semiconductor layers S1 and S3 by 0.1 eV or more and 1.2 eV or less, preferably 0.2 eV or more and 0.8 eV or less is used.

To increase the on-state current of a top-gate transistor, for example, the thickness of the oxide semiconductor layer S3 is preferably as small as possible. For example, the thickness of the oxide semiconductor layer S3 is less than 10 nm, preferably 5 nm or less, further preferably 3 nm or less. On the other hand, the oxide semiconductor layer S3 is preferably not too thin because it blocks entry of elements (e.g., silicon) contained in a gate insulating film to the oxide semiconductor layer S2 having a high current density. For example, the thickness of the oxide semiconductor layer S3 is 0.3 nm or more, preferably 1 nm or more, further preferably 2 nm or more.

It is preferable that the oxide semiconductor layer S1 be thick and the oxide semiconductor layers S2 and S3 be thin. Specifically, the thickness of the oxide semiconductor layer S1 is 20 nm or more, preferably 30 nm or more, further preferably 40 nm or more, still further preferably 60 nm or more. In such a case, the interface between an insulating film and the oxide semiconductor layer S1 can be separated from the oxide semiconductor layer S2 having a high current density, with a distance of 20 nm or more, preferably 30 nm or more, further preferably 40 nm or more, still further preferably 60 nm or more. Note that to prevent the productivity of a signal processing device from being lowered, the thickness of the oxide semiconductor layer S1 is 200 nm or less, preferably 120 nm or less, further preferably 80 nm or less. The thickness of the oxide semiconductor layer S2 ranges from 3 nm to 100 nm, preferably from 3 nm to 80 nm, further from 3 nm to 50 nm.

For example, the thickness of the oxide semiconductor layer S1 can be larger than that of the oxide semiconductor layer S2, and the thickness of the oxide semiconductor layer S2 can be larger than that of the oxide semiconductor layer S3.

A single layer or a multilayer film of the above oxide semiconductor can be used for the channel of the first transistor TR1.

Embodiment 2

Figure 3A:
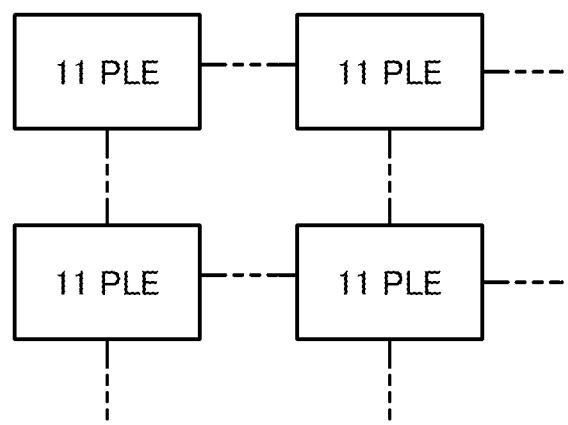
FIGS. 3A and 3B illustrate structure examples of a PLD and a programmable logic element (PLE)

FIG. 3A is a block diagram illustrating the structure of a programmable logic device (PLD). Although a block diagram attached to this specification shows components classified by their functions in independent blocks, it is difficult to completely classify actual components according to their functions, and it is possible for one component to have a plurality of functions.

As illustrated in FIG. 3A, a PLD 10 includes a plurality of programmable logic elements (PLEs) 11. Each PLE 11 is controlled in accordance with configuration data including information for defining a signal transmission path or the like between the PLEs 11.

Specifically, a signal transmission path or the like between the PLEs 11 can be controlled by a wiring element that includes a wiring group and a switch. The wiring group includes a plurality of wirings. The switch controls selection of at least one wiring from the wirings included in the wiring group in accordance with configuration data.

Figure 3B:
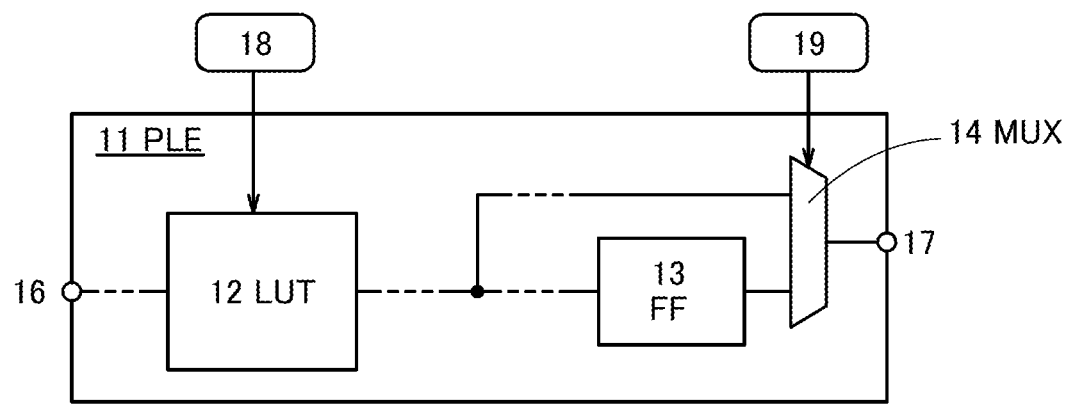

FIG. 3B is a block diagram illustrating a structure example of the PLE 11. The PLE 11 includes at least a look-up table (LUT) 12, a flip-flop (FF) 13, and a multiplexer (MUX) 14.

Configuration data 18 including information for specifying the function of the LUT 12 as a logic gate is input to the LUT 12. In other words, the relationship between the logic level (e.g., "1" or "0") of a signal input from a terminal 16 to the LUT 12 and the logic level of a signal output from the LUT 12 is determined in accordance with the configuration data 18.

The signal output from the LUT 12 is input to the FF 13. A signal output from the FF 13 included in one PLE 11 may be input to the FF 13 included in another PLE 11. The FF 13 has a function of holding these input signals.

Configuration data 19 including information for controlling the operation of the MUX 14 is input to the MUX 14. The MUX 14 has a function of selecting any one of signals output from the LUT 12 and the FF 13 in accordance with the configuration data 19. The signal selected by the MUX 14 is output from a terminal 17 of the PLE 11.

<Structure Example of Multiplexer>

Figure 4:
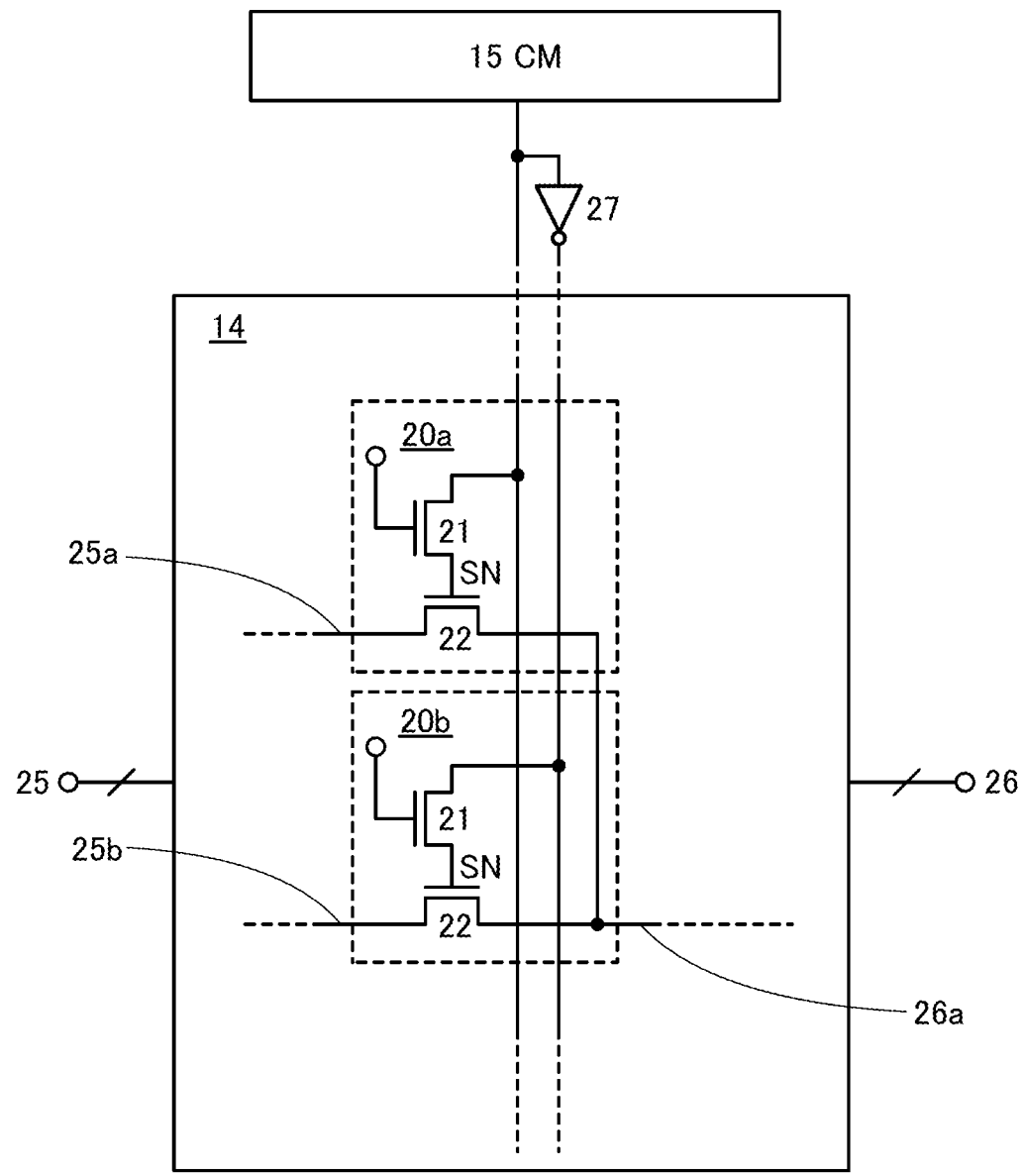
FIG. 4 illustrates a structure example of a multiplexer.

FIG. 4 illustrates a specific structure example of the MUX 14. The MUX 14 in FIG. 4 includes at least a programmable switch 20a and a programmable switch 20b. The MUX 14 has a function of selecting any one of signals input to a plurality of wirings 25 (a wiring 25a, a wiring 25b, and the like) by controlling the operation of the programmable switches 20a and 20b in accordance with a signal including configuration data that is input from a configuration memory (CM) 15 to supply the selected signal to one of at least one wiring 26. The CM 15 corresponds to a register for storing configuration data.

The programmable switch 20a has a function of controlling whether to supply a signal input to the wiring 25a to a wiring 26a, which is one of at least one wiring 26, in accordance with a signal including configuration data that is input from the CM 15. Further, the programmable switch 20b has a function of controlling whether to supply a signal input to the wiring 25b to the wiring 26a in accordance with a signal including configuration data that is input from the CM 15.

The programmable switches 20a and 20b each include a transistor 21 and a transistor 22. The transistor 21 has a function of controlling input of a signal including configuration data to a gate of the transistor 22. The on/off state of the transistor 22 is determined in accordance with a signal including configuration data that is input to the gate of the transistor 22. When the transistor 22 is on, a signal input to the wiring 25a or the wiring 25b is supplied to the wiring 26a through the transistor 22. On the other hand, when the transistor 22 is off, a signal input to the wiring 25a or the wiring 25b is not supplied to the wiring 26a.

Specifically, a signal including configuration data is input to one of a source and a drain of the transistor 21, and the other of the source and the drain of the transistor 21 is connected to the gate of the transistor 22. One of a source and a drain of the transistor 22 is connected to the wiring 25a or the wiring 25b, and the other of the source and the drain of the transistor 22 is connected to the wiring 26a.

Logic levels of signals including configuration data that are input to the programmable switches 20a and 20b are different from each other. Specifically, FIG. 4 illustrates the case where the logic level of a signal input to the programmable switch 20a is inverted by an inverter 27 and the inverted signal is input to the programmable switch 20b. Alternatively, signals with different logic levels may be input to the programmable switches 20a and 20b from the CM 15 without the use of the inverter 27.

Although FIG. 4 illustrates the structure where the inverter 27 is not included in the MUX 14, the MUX 14 may include the inverter 27.

With such a structure, the transistor 22 is turned on in one of the programmable switches 20a and 20b, and the transistor 22 is turned off in the other of the programmable switches 20a and 20b. That is, only one of the signals input to the wirings 25a and 25b is selected by the programmable switches 20a and 20b to be supplied to the wiring 26a. As illustrated in FIG. 4, both the wiring 25a and the wiring 25b are connected to the wiring 26a apparently (or in the circuit configuration) through the programmable switches 20a and 20b, respectively (or through the respective transistors 22 therein); that is, the programmable switch 20a is provided between the wirings 25a and 26a, and the programmable switch 20b is provided between the wirings 25b and 26a. However, only one of the wirings 25a and 25b is substantially connected to the wiring 26a.

Note that depending on the number of the wirings 25, a plurality of switches 20a and a plurality of switches 20b may be provided in the MUX 14. In such a case, a plurality of wirings 26a to which signals selected by the plurality of switches 20a and the plurality of switches 20b are input are provided in the MUX 14. The MUX 14 having such a structure also includes one or more programmable switches 20a and one or more programmable switches 20b for further selecting from the signals input to the plurality of wirings 26a. By selecting signals with the plurality of programmable switches 20a and 20b repeatedly, one or a plurality of signals may be eventually output from the MUX 14.

The transistor 21 has significantly lower off-state current than the transistor 22. A transistor in which a channel formation region is formed in a film of a semiconductor having a wider band gap and lower intrinsic carrier density than silicon has extremely low off-state current and thus is preferably used as the transistor 21. Examples of such a semiconductor are an oxide semiconductor and gallium nitride that have a band gap more than twice as wide as that of silicon. A transistor including the above semiconductor can have much lower off-state current than a normal transistor including a semiconductor such as silicon or germanium.

The transistor 21 with such a structure can prevent leakage of charge held at the node SN when the transistor 21 is off. The on/off state of the transistor 22 is maintained by the charge held at the node SN; thus, a signal is selected continuously by the programmable switch 20a or the programmable switch 20b.

Since the node SN becomes floating in the programmable switches 20a and 20b when the transistor 21 is off, the boosting effect described in Embodiment 1 can be expected. In other words, when the node SN is floating in the programmable switches 20a and 20b, the potential of the node SN is increased by a capacitance generated between the source and the gate of the transistor 22 as the potential of the wiring 25a or the wiring 25b changes from low level to high level. The increase in potential of the node SN depends on the logic level of configuration data input to the gate of the transistor 22.

Even when the potential of a signal input to the gate of the transistor 22 is lowered, that is, even when a potential applied to the gate is lowered, the MUX 14 can correctly operate by the boosting effect. Note that although a capacitor connected to the node SN is not shown in FIG. 4, there is a parasitic capacitance between the node SN and a wiring, for example. Needless to say, a capacitor may be intentionally connected to the node SN. To obtain the boosting effect, capacitance or the like should be set on the basis of the design criteria shown in Embodiment 1.

<Operation Example of Programmable Switch>

Figure 5A:
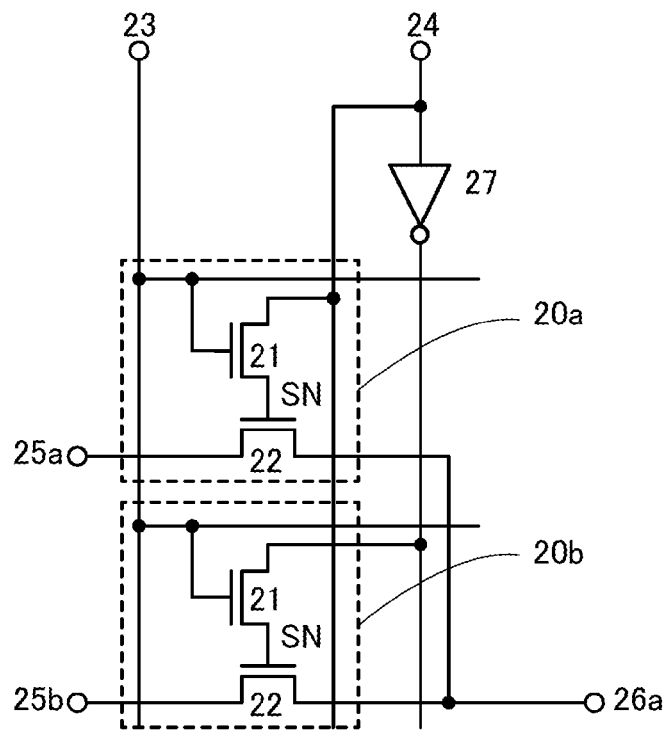
FIGS. 5A and 5B illustrate a structure example and a timing chart of a multiplexer.
Figure 5B:
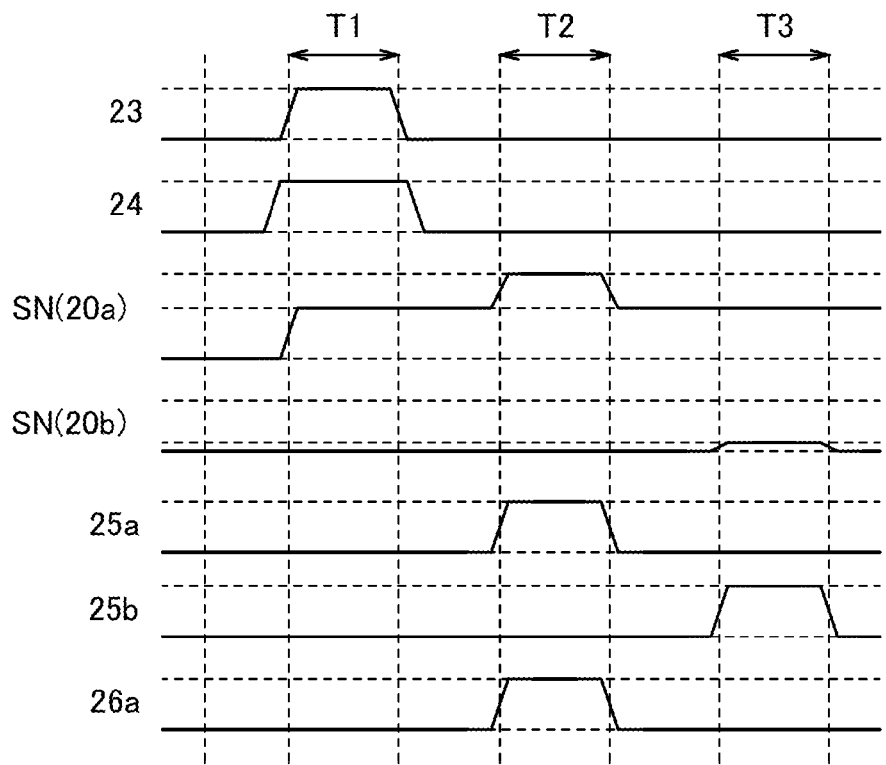

Next, an operation example of the programmable switches 20a and 20b in FIG. 4 will be described. FIG. 5A illustrates a connection example of the programmable switches 20a and 20b and the wirings illustrated in FIG. 4. FIG. 5B is an example of a timing chart of signals input to the wirings and the potentials of the nodes SN in the programmable switches 20a and 20b.

In each of the programmable switches 20a and 20b in FIG. 5A, the gate of the transistor 21 is connected to a wiring 23. One of the source and the drain of the transistor 21 in the programmable switch 20a is connected to a wiring 24. One of the source and the drain of the transistor 21 in the programmable switch 20b is connected to an output terminal of the inverter 27. An input terminal of the inverter 27 is connected to the wiring 24.

As illustrated in FIG. 5B, when a high-level potential is applied to the wiring 23 in a period T1, the transistor 21 in each of the programmable switches 20a and 20b is turned on. When the high-level potential corresponding to a logic level "1" is applied to the wiring 24, the high-level potential corresponding to the logic level "1" is applied to the node SN through the transistor 21 in the programmable switch 20a. A low-level potential corresponding to a logic level "0" is applied to the node SN through the transistor 21 in the programmable switch 20b. Note that the potential applied to the node SN in the programmable switch 20a is lower than the potential of the wiring 24 by the threshold voltage of the transistor 21.

After the period T1, a low-level potential is applied to the wiring 23, so that the transistor 21 in each of the programmable switches 20a and 20b is turned off. Thus, the potential of the node SN is held in each of the programmable switches 20a and 20b.

Next, in a period T2, the potential of the wiring 25a changes from low level to high level, and a low-level potential is applied to the wiring 25b. In the programmable switch 20a, the node SN is floating and the transistor 22 is in the strong inversion mode; thus, the potential of the node SN is further increased by the boosting effect as the potential of the wiring 25a changes from low level to high level. On the other hand, in the programmable switch 20b, a low-level potential is applied to the wiring 25b and the transistor 22 is in the weak inversion mode; thus, the potential of the node SN is kept at low level. Accordingly, the transistor 22 in the programmable switch 20a is on and the transistor 22 in the programmable switch 20b is off, so that the potential of the wiring 25a is applied to the wiring 26a through the programmable switch 20a. Note that the potential of the node SN in the programmable switch 20a is higher than the high-level potential, and when the potential difference between the node SN and the wiring 25a is larger than the threshold voltage of the transistor 22, the potential of the wiring 26a is substantially equal to that of the wiring 25a.

Next, in a period T3, a low-level potential is applied to the wiring 25a, and the potential of the wiring 25b changes from low level to high level. In the programmable switch 20a, the node SN is floating and the transistor 22 is in the strong inversion mode. However, the potential of the wiring 25a is at low level; thus, the node SN holds the potential applied in the period T1, i.e., the potential that is lower than the potential of the wiring 24 by the threshold voltage of the transistor 21. On the other hand, in the programmable switch 20b, since the node SN is floating, the potential of the node SN is increased by the boosting effect as the potential of the wiring 25b changes from low level to high level. Note that in the programmable switch 20b, the transistor 22 is in the weak inversion mode; thus, the increase in potential of the node SN is smaller than that in the programmable switch 20a in the period T2. Accordingly, the transistor 22 in the programmable switch 20b is kept off. Since the potential of the wiring 25a is at low level and the transistor 22 in the programmable switch 20b is off, the potential of the wiring 26a becomes low level.

Figure 6:
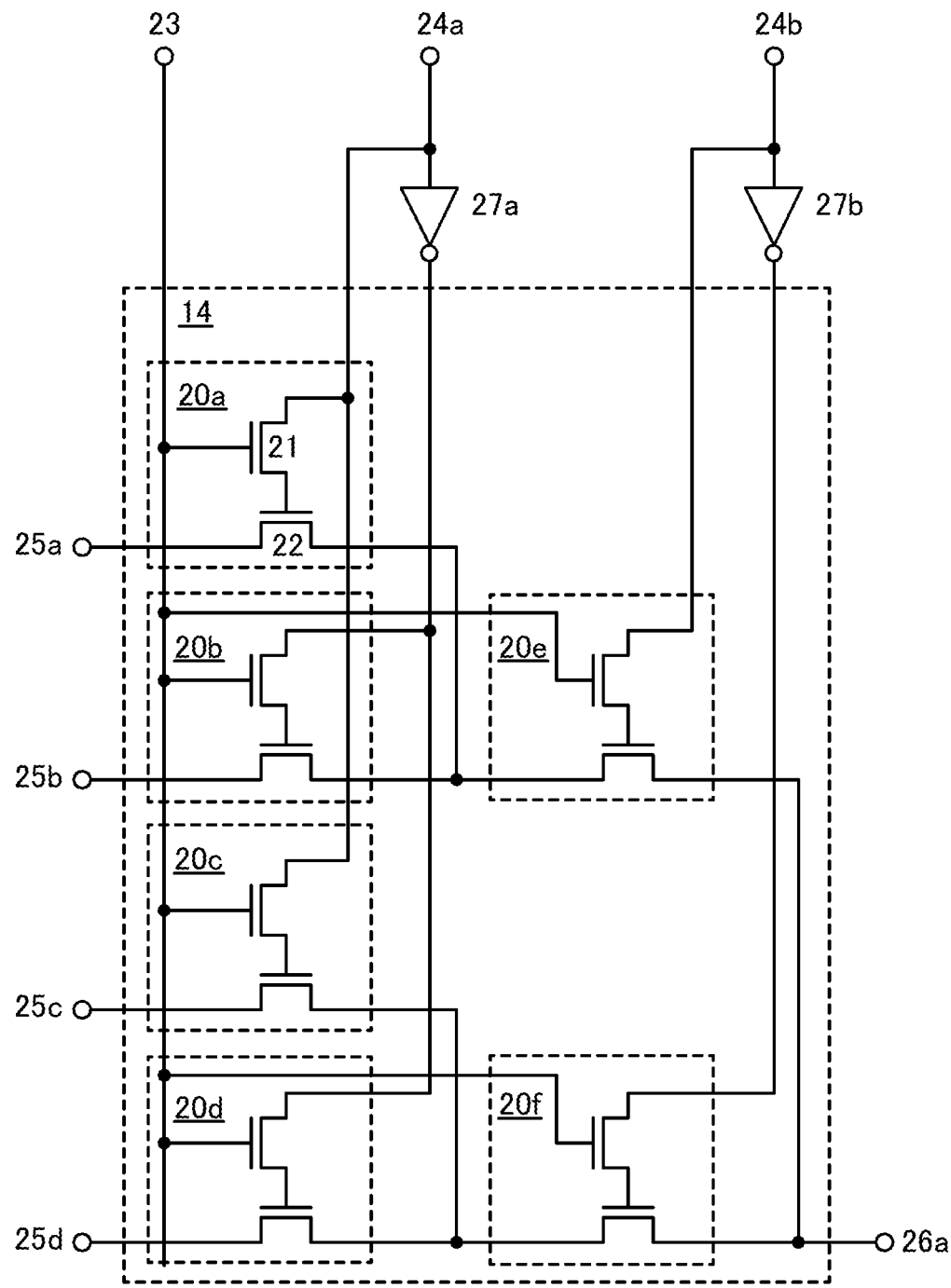
FIG. 6 illustrates a structure example of a multiplexer.

FIG. 6 illustrates a structure example of the MUX 14 to which a 2-bit signal is input. The MUX 14 in FIG. 6 includes six programmable switches 20 (programmable switches 20a to 20f). The programmable switches 20a to 20f each include the transistors 21 and 22. Connection between the transistors 21 and 22 is the same as that in the MUX 14 illustrated in FIG. 4.

Note that in the MUX 14 in FIG. 6, one of the source and the drain of the transistor 21 included in each of the programmable switches 20a and 20c is connected to a wiring 24a to which a signal including configuration data is input. One of the source and the drain of the transistor 21 in each of the programmable switches 20b and 20d is connected to an output terminal of an inverter 27a. An input terminal of the inverter 27a is connected to the wiring 24a. One of the source and the drain of the transistor 21 included in the programmable switch 20e is connected to a wiring 24b to which a signal including configuration data is input. One of the source and the drain of the transistor 21 in the programmable switch 20f is connected to an output terminal of an inverter 27b. An input terminal of the inverter 27b is connected to the wiring 24b.

In addition, in the MUX 14 in FIG. 6, one of the source and the drain of the transistor 22 in each of the programmable switches 20a to 20d is connected to respective wirings 25a to 25d. The other of the source and the drain of the transistor 22 in each of the programmable switches 20a and 20b is connected to one of the source and the drain of the transistor 22 in the programmable switch 20e. The other of the source and the drain of the transistor 22 in each of the programmable switches 20c and 20d is connected to one of the source and the drain of the transistor 22 in the programmable switch 20f. The other of the source and the drain of the transistor 22 in each of the programmable switches 20e and 20f is connected to the wiring 26a.

In the MUX 14 in FIG. 6, the on/off state of the transistor 22 is determined in accordance with signals including configuration data that are input from the wirings 24a and 24b. Any one of signals input to the wirings 25a to 25d is selected by the programmable switches 20a to 20f in accordance with configuration data and is input to the wiring 26a.

<Structure Examples of PLE>

Figure 7A:
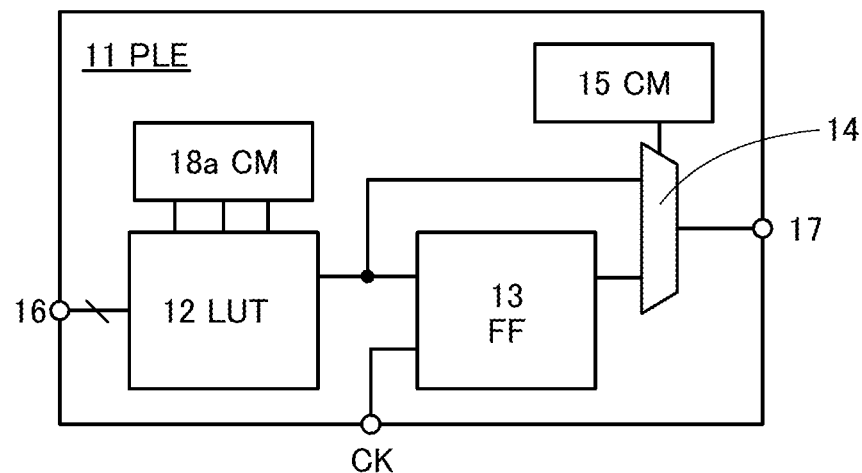
FIGS. 7A and 7B each illustrate a structure example of a PLE.

Next, FIG. 7A illustrates a specific structure example of the PLE 11 in FIG. 3B. The PLE 11 in FIG. 7A includes the LUT 12, the FF 13, the MUX 14, a CM 18a that stores the configuration data 18 for the LUT 12, and the CM 15 that stores configuration data 19 for the MUX 14.

Logical operation executed by the LUT 12 varies depending on configuration data stored in the CM 18a. When the logical operation executed by the LUT 12 is determined by the configuration data, the LUT 12 generates an output signal corresponding to a plurality of input signals supplied to the terminal 16. The FF 13 holds the output signal generated in the LUT 12 and outputs an output signal corresponding to the output signal of the LUT 12 in synchronization with a signal CK.

Signals output from the LUT 12 and the FF 13 are input to the MUX 14. The MUX 14 has a function of selecting and outputting one of these two output signals in accordance with configuration data stored in the CM 15. A signal output from the MUX 14 is supplied to the terminal 17.

Figure 7B:
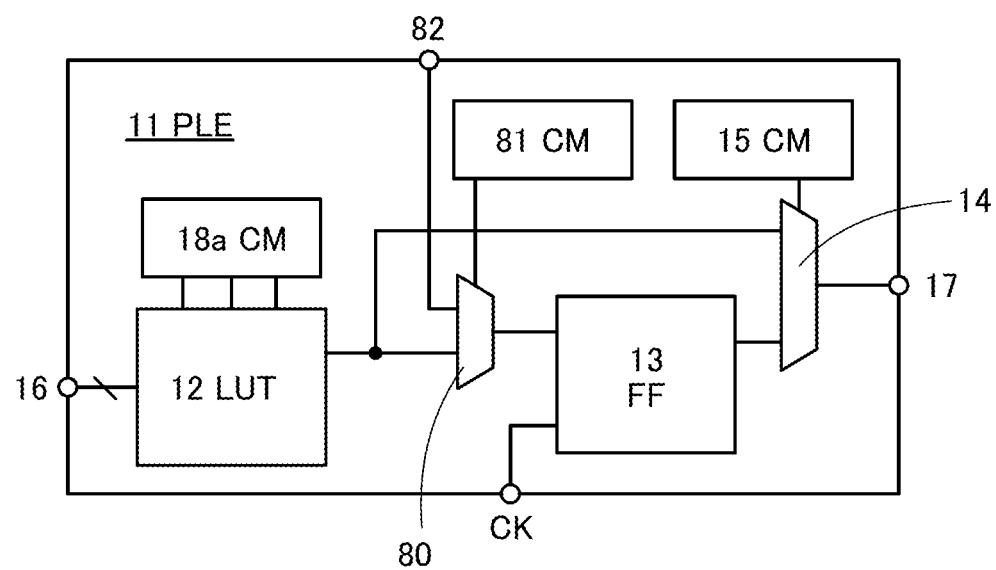

FIG. 7B illustrates another specific structure example of the PLE 11 in FIG. 3B. The PLE 11 in FIG. 7B differs from the PLE 11 in FIG. 7A in including an MUX 80 and a CM 81 that stores configuration data for the MUX 80.

A signal output from the LUT 12 and a signal output from the FF 13 included in another PLE 11 are input to the MUX 80. The signal output from the FF 13 is input from a terminal 82. The MUX 80 has a function of selecting and outputting one of these two output signals in accordance with configuration data stored in the CM 81.

In the PLE 11 in FIG. 7B, the FF 13 holds the signal output from the MUX 80 and outputs an output signal corresponding to the signal output from the LUT 12 in synchronization with the signal CK.

Note that in the PLE 11 illustrated in FIG. 7A or FIG. 7B, configuration data may determine the kind of the FF 13. Specifically, the FF 13 may function as any of a D flip-flop, a T flip-flop, a JK flip-flop, and an RS flip-flop depending on configuration data.

<Structure Example of PLD>

Figure 8A:
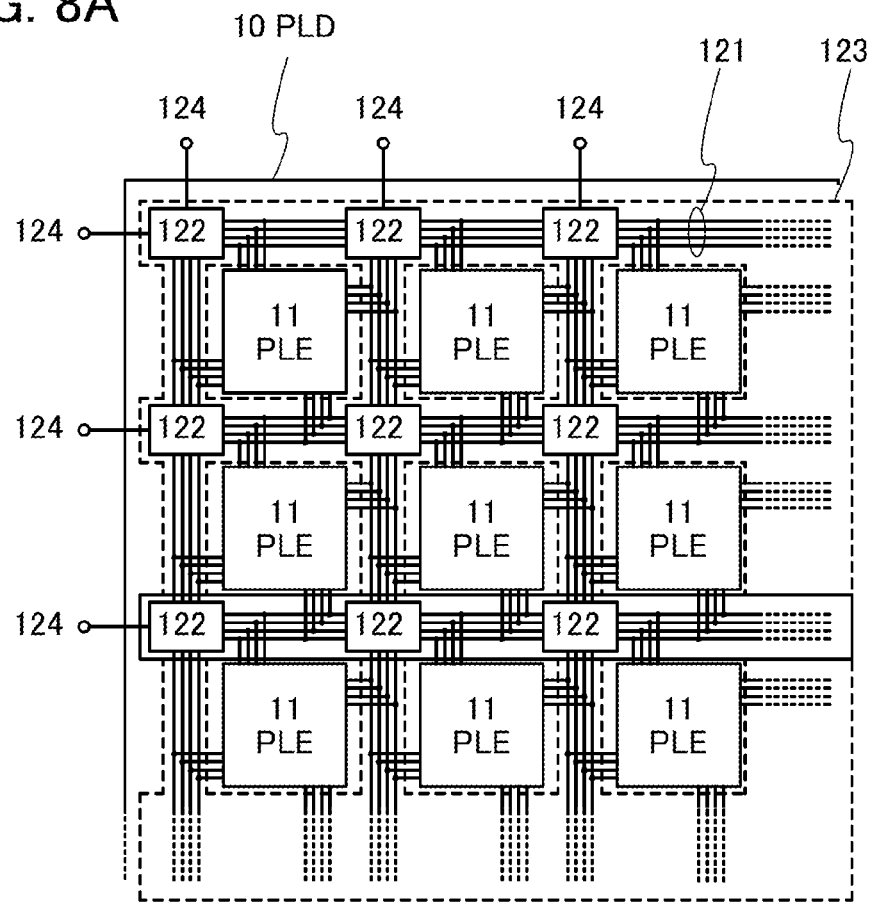
FIGS. 8A and 8B illustrate structure examples of a PLD and a switch.

FIG. 8A schematically illustrates part of the PLD 10 as an example. The PLD 10 in FIG. 8A includes a plurality of PLEs 11, a wiring group 121 connected to any of the plurality of PLEs 11, and switch regions 122 for controlling connection between wirings included in the wiring groups 121. The wiring group 121 and the switch regions 122 correspond to a routing resource 123. Connection and disconnection between the wirings controlled by the switch regions 122 are determined by configuration data.

Figure 8B:
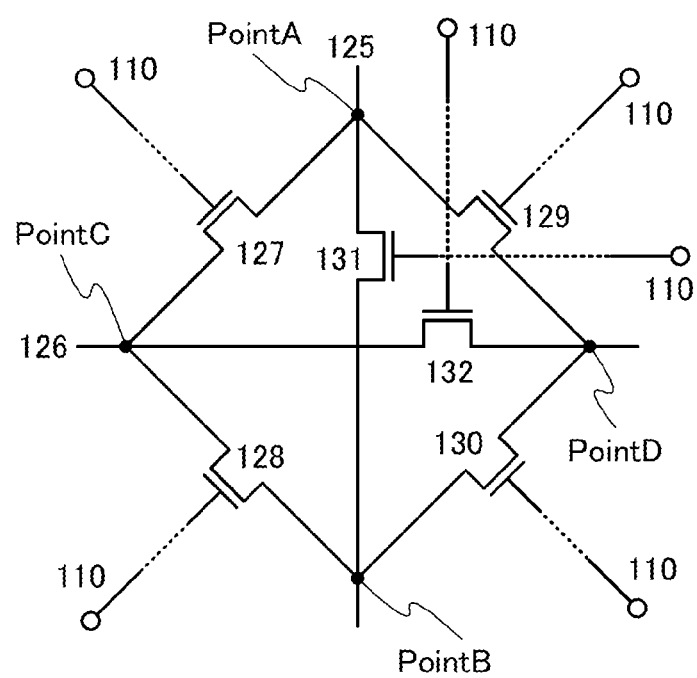

FIG. 8B illustrates a configuration example of the switch region 122. The switch region 122 in FIG. 8B has a function of controlling connection and disconnection between a wiring 125 and a wiring 126 included in the wiring group 121. Specifically, the switch region 122 includes transistors 127 to 132. The transistor 127 has a function of controlling electrical connection between a point A of the wiring 125 and a point C of the wiring 126. The transistor 128 has a function of controlling electrical connection between a point B of the wiring 125 and the point C of the wiring 126. The transistor 129 has a function of controlling electrical connection between the point A of the wiring 125 and a point D of the wiring 126. The transistor 130 has a function of controlling electrical connection between the point B of the wiring 125 and the point D of the wiring 126. The transistor 131 has a function of controlling electrical connection between the point A and the point B of the wiring 125. The transistor 132 has a function of controlling electrical connection between the point C and the point D of the wiring 126.

The on/off state of each of the transistors 127 to 132 is selected (switched) in accordance with configuration data. Specifically, in the PLD 10, the potentials of signals input to gates of the transistors 127 to 132 are determined by configuration data.

The switch regions 122 also have a function of controlling electrical connection between the wiring group 121 and output terminals 124 of the PLD 10.

Figure 9:
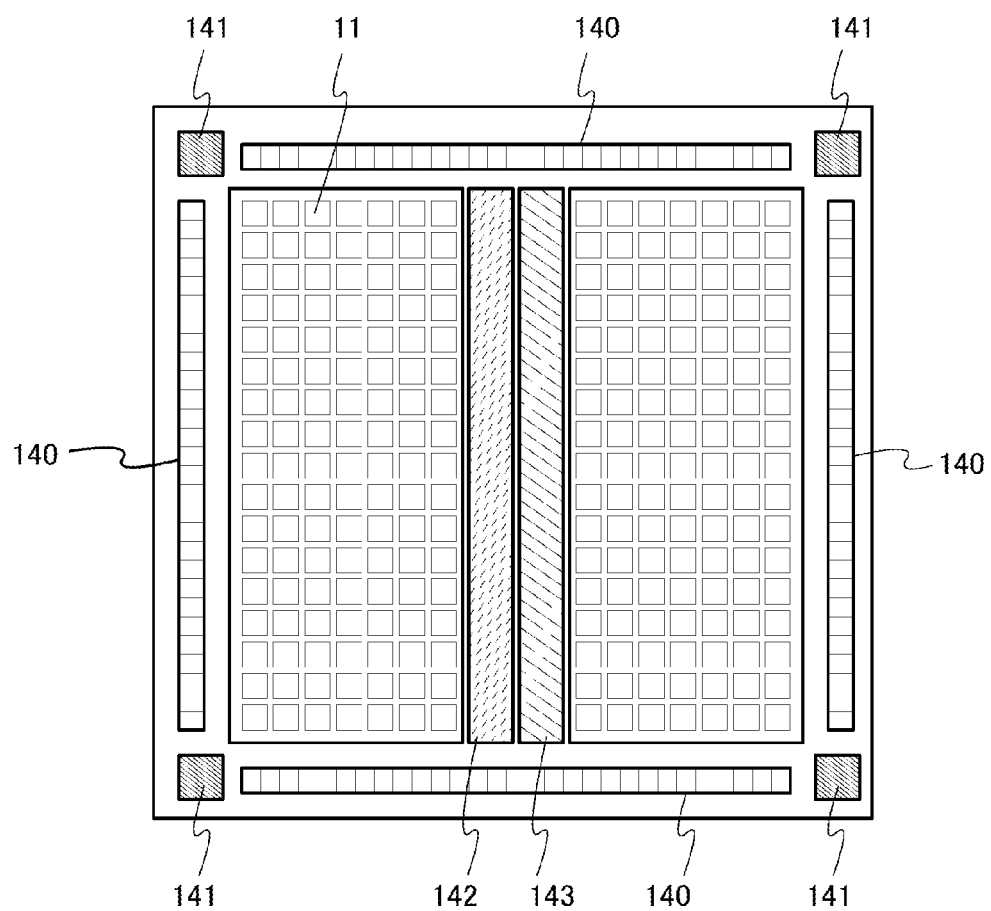
FIG. 9 illustrates a structure example of the entire PLD.

FIG. 9 illustrates a structure example of the entire PLD 10. In FIG. 9, I/O elements 140, phase lock loops (PLLs) 141, RAM 142, and a multiplier 143 are provided in the PLD 10. The I/O element 140 functions as an interface that controls input and output of signals from and to an external circuit of the PLD 10. The PLL 141 has a function of generating the signal CK. The RAM 142 has a function of storing data used for logical operation. The multiplier 143 corresponds to a logic circuit for multiplication. When the PLD 10 has a function of executing multiplication, the multiplier 143 is not necessarily provided.

<Cross-Sectional Structure Examples of PLD>

Figure 10:
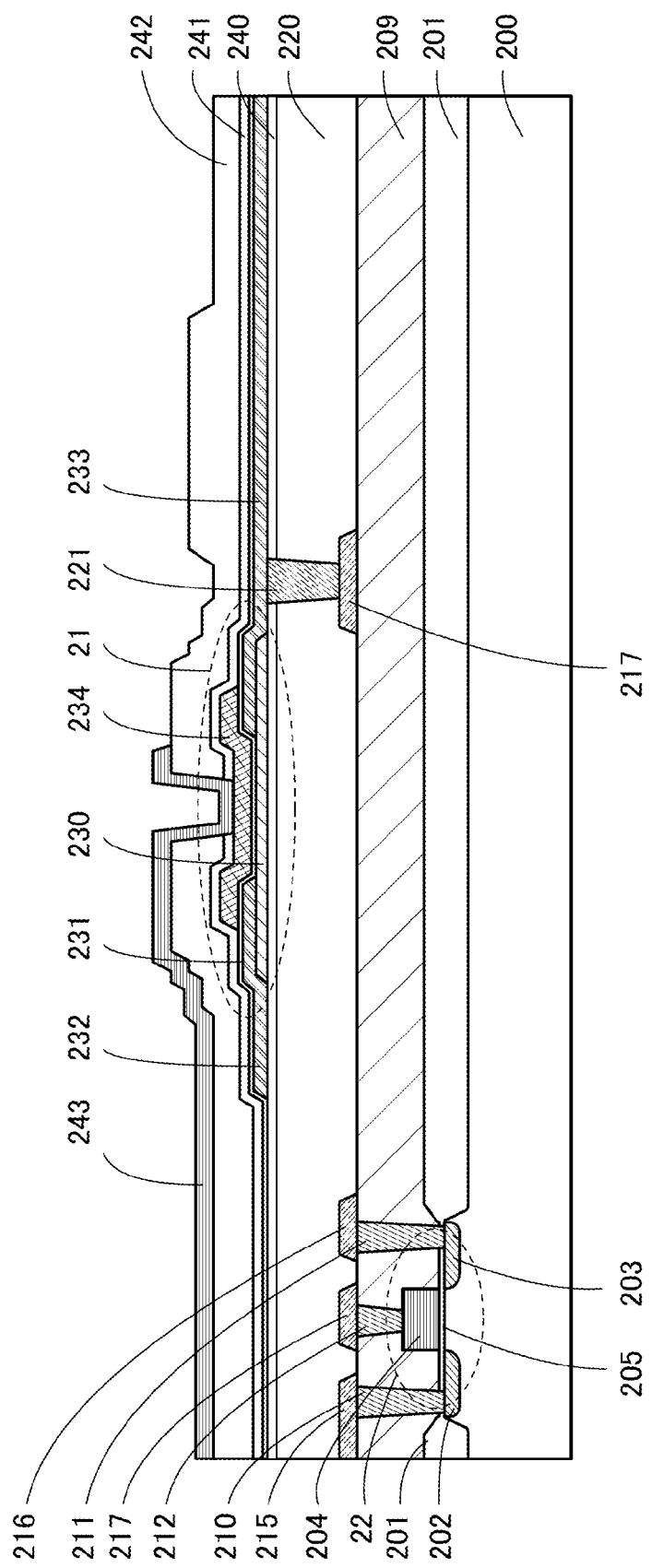
FIG. 10 illustrates an example of a cross-sectional structure of a PLD.

FIG. 10 illustrates an example of a cross-sectional structure of the PLD. In FIG. 10, the transistor 21 including a channel formation region in an oxide semiconductor film is formed over the transistor 22 including a channel formation region in a single crystal silicon substrate.

Note that the transistor 22 can include a semiconductor film of silicon, germanium, or the like in an amorphous, microcrystalline, polycrystalline, or single crystal state for an active layer. Alternatively, the transistor 22 may include a channel formation region in an oxide semiconductor film. In the case where the transistors each include a channel formation region in an oxide semiconductor film, the transistor 21 is not necessarily stacked over the transistor 22, and the transistors 21 and 22 may be formed in the same layer.

When the transistor 22 is formed using a silicon thin film, any of the following can be used, for example: amorphous silicon formed by sputtering or vapor phase growth such as plasma-enhanced CVD; polycrystalline silicon obtained by crystallization of amorphous silicon by laser annealing or the like; and single crystal silicon obtained by separation of a surface portion of a single crystal silicon wafer by implantation of hydrogen ions or the like into the silicon wafer.

A semiconductor substrate 200 where the transistor 22 is formed can be, for example, an n-type or p-type silicon substrate, germanium substrate, silicon germanium substrate, or compound semiconductor substrate (e.g., GaAs substrate, InP substrate, GaN substrate, SiC substrate, GaP substrate, GaInAsP substrate, or ZnSe substrate). FIG. 10 illustrates an example in which a single crystal silicon substrate having n-type conductivity is used.

The transistor 22 is electrically isolated from another transistor by an element isolation insulating film 201. The element isolation insulating film 201 can be formed by a local oxidation of silicon (LOCOS) method, a trench isolation method, or the like.

Specifically, the transistor 22 includes impurity regions 202 and 203 that are formed in the semiconductor substrate 200 and function as a source region and a drain region, a gate electrode 204, and a gate insulating film 205 between the semiconductor substrate 200 and the gate electrode 204. The gate electrode 204 overlaps a channel formation region between the impurity regions 202 and 203 with the gate insulating film 205 positioned between the gate electrode 204 and the channel formation region.

An insulating film 209 is provided over the transistor 22. Openings are formed in the insulating film 209. A wiring 210 in contact with the impurity region 202, a wiring 211 in contact with the impurity region 203, and a wiring 212 electrically connected to the gate electrode 204 are formed in the openings.

The wiring 210 is electrically connected to a wiring 215 over the insulating film 209. The wiring 211 is electrically connected to a wiring 216 over the insulating film 209. The wiring 212 is electrically connected to a wiring 217 over the insulating film 209.

An insulating film 220 and an insulating film 240 are stacked in this order over the wirings 215 to 217. An opening is formed in the insulating films 220 and 240. A wiring 221 electrically connected to the wiring 217 is formed in the opening.

In FIG. 10, the transistor 21 is formed over the insulating film 240.

The transistor 21 includes, over the insulating film 240, a semiconductor film 230 containing an oxide semiconductor, conductive films 232 and 233 that are positioned over the semiconductor film 230 and function as a source electrode and a drain electrode, a gate insulating film 231 over the semiconductor film 230 and the conductive films 232 and 233, and a gate electrode 234 that is positioned over the gate insulating film 231 and overlaps the semiconductor film 230 between the conductive films 232 and 233. Note that the conductive film 233 is electrically connected to the wiring 221.

An insulating film 241 and an insulating film 242 are stacked in this order over the transistor 21. An opening is formed in the insulating films 241 and 242. A conductive film 243 that is in contact with the gate electrode 234 in the opening is provided over the insulating film 241.

Note that in FIG. 10, the transistor 21 includes the gate electrode 234 on at least one side of the semiconductor film 230; alternatively, the transistor 21 may include a pair of gate electrodes with the semiconductor film 230 laid therebetween.

When the transistor 21 includes a pair of gate electrodes with the semiconductor film 230 placed therebetween, one of the gate electrodes may be supplied with a signal for controlling the on/off state, and the other of the gate electrodes may be supplied with a potential from a different component. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 10, the transistor 21 has a single-gate structure where one channel formation region corresponding to one gate electrode 234 is provided. Alternatively, the transistor 21 may have a multi-gate structure where a plurality of channel formation regions are included in one active layer by providing a plurality of gate electrodes electrically connected to each other.

Figure 11:
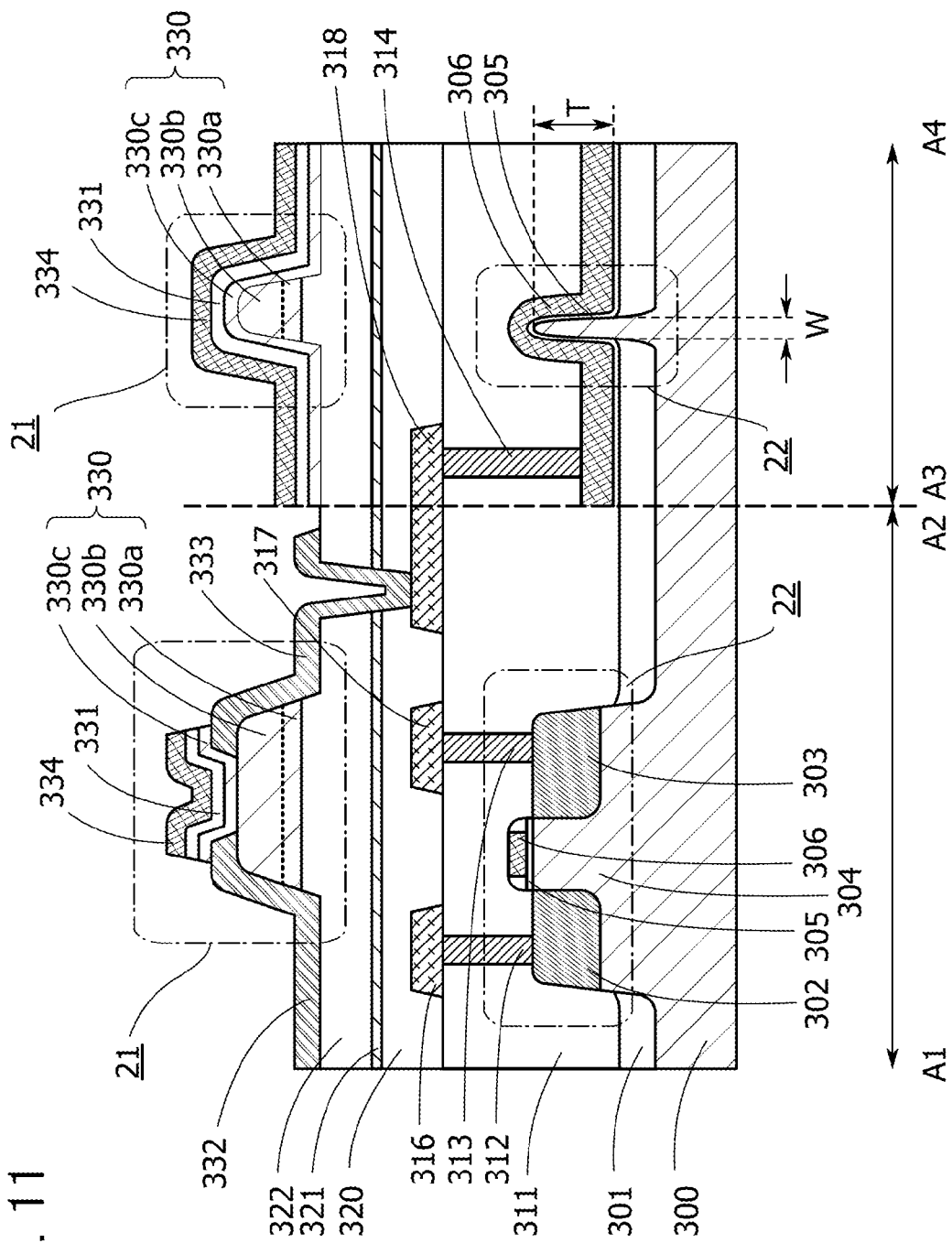
FIG. 11 illustrates an example of a cross-sectional structure of a PLD.

FIG. 11 illustrates another structure example of the PLD.

In FIG. 11, the cross section A1-A2 shows the transistors 21 and 22 in the channel length direction (the direction from the source to the drain), and the cross section A3-A4 shows the transistors 21 and 22 in the channel width direction (the direction perpendicular to the channel length direction). Note that in the layout, the channel length direction of the transistor 21 does not necessarily agree with that of the transistor 22. In FIG. 11, the transistor 21 including a channel formation region in an oxide semiconductor film is formed over the transistor 22 including a channel formation region in single crystal silicon. FIG. 11 illustrates an example in which a single crystal silicon substrate is used as a semiconductor substrate 300.

The transistor 22 is electrically isolated from other semiconductor elements by an element isolation method. An example of the element isolation method is a trench isolation method (shallow trench isolation: STI). FIG. 11 illustrates an example where the trench isolation method is used to electrically isolate the transistor 22. Specifically, in FIG. 11, the transistor 22 is electrically isolated by using an element isolation insulating film 301 formed in such a manner that an insulator containing silicon oxide or the like is buried in a trench formed in the semiconductor substrate 300 by etching or the like and then the insulator is removed partly by etching or the like.

In a projection of the semiconductor substrate 300 that exists in a region other than the trench, an impurity region 302 and an impurity region 303 of the transistor 22 and a channel formation region 304 placed between the impurity regions 302 and 303 are provided. The transistor 22 also includes an insulating film 305 covering the channel formation region 304 and a gate electrode 306 that overlaps the channel formation region 304 with the insulating film 305 placed therebetween.

In the transistor 22, a side portion and an upper portion of the projection in the channel formation region 304 overlaps with the gate electrode 306 with the insulating film 305 positioned therebetween, so that carriers flow in a wide area (including a side portion and an upper portion of the channel formation region 304). Thus, an area over the substrate occupied by the transistor 22 is reduced, and the number of transferred carriers in the transistor 22 is increased. As a result, the field-effect mobility and on-state current are increased in the transistor 22. Suppose the length of the projection of the channel formation region 304 in the channel width direction (i.e., channel width) is W and the thickness of the projection of the channel formation region 304 is T. When the aspect ratio that corresponds to the ratio of the thickness T to the channel width W is high, a region where carrier flows becomes wider. Thus, the on-state current of the transistor 22 is further increased and the field-effect mobility of the transistor 22 is further increased.

Note that when the transistor 22 is formed using a bulk semiconductor substrate, the aspect ratio is preferably 0.5 or more, further preferably 1 or more.

An insulating film 311 is provided over the transistor 22. Openings are formed in the insulating film 311. A conductive film 312, a conductive film 313, and a conductive film 314 that are electrically connected to the impurity region 302, the impurity region 303, and the gate electrode 306, respectively, are formed in the openings. The conductive film 312 is electrically connected to a conductive film 316 over the insulating film 311. The conductive film 313 is electrically connected to a conductive film 317 over the insulating film 311. The conductive film 314 is electrically connected to a conductive film 318 over the insulating film 311.

An insulating film 320 is provided over the conductive films 316 to 318. An insulating film 321 having an effect of blocking diffusion of oxygen, hydrogen, and water is provided over the insulating film 320. An insulating film 322 is provided over the insulating film 321. The transistor 21 is provided over the insulating film 322.

As the insulating film 321 has higher density and becomes denser or has a fewer dangling bonds and becomes more chemically stable, the insulating film 321 has a higher blocking effect. The insulating film 321 having an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 321 having an effect of blocking diffusion of hydrogen and water can be formed using silicon nitride or silicon nitride oxide, for example.

The transistor 21 includes a semiconductor film 330, conductive films 332 and 333 in contact with the semiconductor film 330, an insulating film 331 covering the semiconductor film 330, and a gate electrode 334 that overlaps the semiconductor film 330 with the insulating film 331 placed therebetween. The conductive films 332 and 333 function as source and drain electrodes. The conductive film 333 is connected to the conductive film 318 in an opening formed in the insulating films 320 to 332.

An insulating film may be provided over the transistor 21. In this case, it is possible that an opening is formed in the insulating film and a conductor that is in contact with the gate electrode 334 in the opening is provided over the insulating film.

Note that in FIG. 11, the transistor 21 includes the gate electrode 334 on at least one side of the semiconductor film 330; alternatively, the transistor 21 may also include a gate electrode that overlaps the semiconductor film 330 with the insulating film 322 placed therebetween.

When the transistor 21 includes a pair of gate electrodes, one of the gate electrodes may be supplied with a signal for controlling the on/off state, and the other of the gate electrodes may be supplied with another potential independently of the one of the gate electrodes. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 11, the transistor 21 has a single-gate structure where one channel formation region corresponding to one gate electrode 334 is provided. When a plurality of gate electrodes electrically connected to each other are provided in the transistor 21, for example, the transistor 21 can have a multi-gate structure where a plurality of channel formation regions are included in one oxide semiconductor film.

In the transistor 21 in FIG. 11, the semiconductor film 330 has a three-layer structure including semiconductor films 330a to 330c. The conductive films 332 and 333 are formed after formation of the semiconductor films 330a and 330b, and the semiconductor film 330c is subsequently formed. However, it is possible that the transistor 21 does not include any one or two of the semiconductor films 330a to 330c.

This application is based on Japanese Patent Application serial no. 2013-102068 filed with Japan Patent Office on May 14, 2013, the entire contents of which are hereby incorporated by reference.

What is claimed is:

1. A signal processing device comprising:
a programmable switch comprising a first transistor, a second transistor, and a first capacitor,
wherein a first terminal of the first transistor is electrically connected to a gate of the second transistor,
wherein a first terminal of the first capacitor is electrically connected to the gate of the second transistor,
wherein a first terminal of the second transistor is electrically connected to a second capacitor,
wherein a first capacitance of the first capacitor is less than twice the sum of a second capacitance and a third capacitance,
wherein the second capacitance is a capacitance of a capacitor between the gate and a second terminal of the second transistor, and
wherein the third capacitance is a combined series capacitance of the second capacitor and a capacitor between the gate and the first terminal of the second transistor.

2. The signal processing device according to claim 1, wherein the first transistor comprises a channel formation region comprising an oxide semiconductor.

3. The signal processing device according to claim 2, wherein the oxide semiconductor comprises In, Ga, and Zn.

4. The signal processing device according to claim 1, wherein the first transistor comprises a channel formation region comprising an oxide semiconductor, wherein the second transistor comprises a channel formation region comprising single crystal silicon, and wherein the first transistor is formed above the second transistor.

5. The signal processing device according to claim 1, wherein the first capacitor is formed only by a parasitic capacitance.

6. The signal processing device according to claim 1, further comprising a first programmable logic element and a second programmable logic element, wherein an output terminal of the first programmable logic element is electrically connected to the second terminal of the second transistor, and wherein an input terminal of the second programmable logic element is electrically connected to the first terminal of the second transistor.

7. The signal processing device according to claim 6, wherein the first programmable logic element comprises a first configuration memory, wherein the second programmable logic element comprises a second configuration memory, wherein a function of the first programmable logic element is changed in accordance with first configuration data stored in the first configuration memory, and wherein a function of the second programmable logic element is changed in accordance with second configuration data stored in the second configuration memory.

8. A signal processing device comprising:
a programmable switch comprising a first transistor, a second transistor, and a first capacitor; and
a third transistor, wherein a first terminal of the first transistor is electrically connected to a gate of the second transistor, wherein a first terminal of the first capacitor is electrically connected to the gate of the second transistor, wherein a first terminal of the second transistor is electrically connected to a gate of the third transistor, and wherein a channel width of the second transistor is at least four times a channel width of the third transistor.

9. The signal processing device according to claim 8, wherein the first transistor comprises a channel formation region comprising an oxide semiconductor.

10. The signal processing device according to claim 9, wherein the oxide semiconductor comprises In, Ga, and Zn.

11. The signal processing device according to claim 8, wherein the first transistor comprises a channel formation region comprising an oxide semiconductor, wherein the second transistor comprises a channel formation region comprising single crystal silicon, and wherein the first transistor is formed above the second transistor.

12. The signal processing device according to claim 8, wherein the first capacitor is formed only by a parasitic capacitance.

13. The signal processing device according to claim 8, further comprising a first programmable logic element and a second programmable logic element, wherein an output terminal of the first programmable logic element is electrically connected to a second terminal of the second transistor, and wherein an input terminal of the second programmable logic element is electrically connected to the first terminal of the second transistor.

14. The signal processing device according to claim 13, wherein the first programmable logic element comprises a first configuration memory, wherein the second programmable logic element comprises a second configuration memory, wherein a function of the first programmable logic element is changed in accordance with first configuration data stored in the first configuration memory, and wherein a function of the second programmable logic element is changed in accordance with second configuration data stored in the second configuration memory.

15. A signal processing device comprising:
a programmable switch comprising a first transistor, a second transistor, and a first capacitor; and
a third transistor, wherein a first terminal of the first transistor is electrically connected to a gate of the second transistor, wherein a first terminal of the first capacitor is electrically connected to the gate of the second transistor, wherein a first terminal of the second transistor is electrically connected to a gate of the third transistor, wherein a first capacitance of the first capacitor is less than twice the sum of a second capacitance and a third capacitance, wherein the second capacitance is a capacitance of a capacitor between the gate and a second terminal of the second transistor, and wherein the third capacitance is a combined series capacitance of a gate capacitor of the third transistor and a capacitor between the gate and the first terminal of the second transistor.

16. The signal processing device according to claim 15, wherein the first transistor comprises a channel formation region comprising an oxide semiconductor.

17. The signal processing device according to claim 16, wherein the oxide semiconductor comprises In, Ga, and Zn.

18. The signal processing device according to claim 15, wherein the first transistor comprises a channel formation region comprising an oxide semiconductor, wherein the second transistor comprises a channel formation region comprising single crystal silicon, and wherein the first transistor is formed above the second transistor.

19. The signal processing device according to claim 15, wherein the first capacitor is formed only by a parasitic capacitance.

20. The signal processing device according to claim 15, further comprising a first programmable logic element and a second programmable logic element, wherein an output terminal of the first programmable logic element is electrically connected to the second terminal of the second transistor, and wherein an input terminal of the second programmable logic element is electrically connected to the first terminal of the second transistor.

* * * * *